US009464366B2

(12) United States Patent
Myers-Ward et al.

(10) Patent No.: US 9,464,366 B2
(45) Date of Patent: Oct. 11, 2016

(54) REDUCTION OF BASAL PLANE DISLOCATIONS IN EPITAXIAL SIC

(75) Inventors: Rachael L Myers-Ward, Springfield, VA (US); David Kurt Gaskill, Alexandria, VA (US); Brenda L VanMil, Missoula, MT (US); Robert E Stahlbush, Silver Spring, MD (US); Charles R. Eddy, Jr., Columbia, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 434 days.

(21) Appl. No.: 12/860,844

(22) Filed: Aug. 20, 2010

(65) Prior Publication Data

US 2011/0045281 A1 Feb. 24, 2011

Related U.S. Application Data

(60) Provisional application No. 61/235,455, filed on Aug. 20, 2009.

(51) Int. Cl.
C30B 29/36 (2006.01)
H01L 21/02 (2006.01)
(Continued)

(52) U.S. Cl.
CPC ............... *C30B 29/36* (2013.01); *C30B 25/20* (2013.01); *H01L 21/02378* (2013.01); *H01L 21/02433* (2013.01); *H01L 21/02477* (2013.01);
(Continued)

(58) Field of Classification Search
CPC ..... C30B 25/20; C30B 29/36; C30B 25/183; H01L 21/30604; H01L 21/02658; H01L 21/02529; H01L 21/02378; H01L 21/02433; H01L 21/02447; H01L 21/02617; H01L 21/3065
See application file for complete search history.

(56) References Cited

U.S. PATENT DOCUMENTS 4,912,064 A 3/1990 Kong et al.
5,679,153 A * 10/1997 Dmitriev et al. ............. 117/106
(Continued)

OTHER PUBLICATIONS

Chen et al., "Growth and characterization of 4H-SiC epilayers on substrates with different off-cut angles" J. Appl. Phys., 98, 114907 (2005).
(Continued)

*Primary Examiner* — Jonathan Langman
(74) *Attorney, Agent, or Firm* — US Naval Research Laboratory; Joseph T. Grunkemeyer

(57) ABSTRACT

A method for reducing/eliminating basal plane dislocations from SiC epilayers is disclosed. An article having: an off-axis SiC substrate having an off-axis angle of no more than 6°; and a SiC epitaxial layer grown on the substrate. The epitaxial layer has no more than 2 basal plane dislocations per $cm^2$ at the surface of the epitaxial layer. A method of growing an epitaxial SiC layer on an off-axis SiC substrate by: flowing a silicon source gas, a carbon source gas, and a carrier gas into a growth chamber under growth conditions to epitaxially grow SiC on the substrate in the growth chamber. The substrate has an off-axis angle of no more than 6°. The growth conditions include: a growth temperature of 1530-1650° C.; a pressure of 50-125 mbar; a C/H gas flow ratio of $9.38 \times 10^{-5}$-$1.5 \times 10^{-3}$; a C/Si ratio of 0.5-3; a carbon source gas flow rate during ramp to growth temperature from 0 to 15 sccm; and an electron or hole concentration of $10^{13}$-$10^{19}/cm^3$.

18 Claims, 3 Drawing Sheets

(51) Int. Cl.
*H01L 21/3065* (2006.01)
*H01L 21/306* (2006.01)
*C30B 25/20* (2006.01)

(52) U.S. Cl.
CPC ... *H01L21/02529* (2013.01); *H01L 21/02617* (2013.01); *H01L 21/02658* (2013.01); *H01L 21/3065* (2013.01); *H01L 21/30604* (2013.01); *Y10T 428/26* (2015.01)

(56) References Cited

U.S. PATENT DOCUMENTS

| | | | |
|---|---|---|---|
| 7,279,115 | B1 | 10/2007 | Sumakeris |
| 8,652,255 | B2 | 2/2014 | Stahlbush et al. |
| 2006/0011128 | A1 | 1/2006 | Ellison et al. |
| 2007/0108450 | A1 | 5/2007 | O'Loughlin et al. |
| 2007/0290211 | A1 | 12/2007 | Nakayama et al. |
| 2009/0114148 | A1 | 5/2009 | Stahlbush et al. |
| 2010/0133550 | A1* | 6/2010 | Zhang et al. ............ 257/77 |
| 2011/0045281 | A1 | 2/2011 | Myers-Ward et al. |
| 2012/0280254 | A1 | 11/2012 | Muto et al. |
| 2013/0217213 | A1 | 8/2013 | Aigo et al. |

OTHER PUBLICATIONS

Ha et al., "Dislocation conversion in 4H silicon carbide epitaxy" J. Crystal Growth, 244, 257-266 (2002).

Kojima et al., "Homoepitaxial growth of 4H-SiC on on-axis (0 0 0 1) C-face substrates by chemical vapor depostion" J. Crystal Growth, 269, 367-376 (2004).

Sumakeris et al., "Techniques for Minimizing the Basal Plane Dislocation Density in SiC Epilayers to Reduce Vf Drift in SiC Bipolar Power Devices" Materials Science Forum, 527-529, 141-146 (2006).

Zhang et al., "Mechanism of eliminating basal plane dislocations in SiC thin films by epitaxy on an etched substrate", Appl. Phys. Lett., 89, 081910 (2006).

Myers-Ward et al., "Turning of Basal Plane Dislocations During Epitaxial Growth on 4° off-axis 4H-SiC" European Conference on Silicon Carbide and Related Materials 08, Barcelona, Spain (Sep. 10, 2008).

Myers-Ward et al. "Turning of Basal Plane Dislocations During Epitaxial Growth on 4° off-axis 4H-SiC" Mat. Sci. Forum 615-617,105-108 (Mar. 2, 2009).

Myers-Ward et al., "Investigation on the Spontaneous Conversion of Basal Plane Dislocations into Threading Edge Dislocations in Epitaxial Layers Grown on 4° Off-Axis 4H-SiC Substrates" 17th American Conference on Crystal Growth and Epitaxy (Aug. 13, 2009).

Stahlbush et al., "Whole-Wafer Mapping of Dislocations in 4H-SiC Epitaxy" Materials Science Forum vols. 556-557 (2007) pp. 295-298.

Stahlbush et al., "Mechanisms of Stacking Fault Growth in SiC PiN Diodes" Mat. Res. Soc. Symp. Proc. vol. 815, J6.4.1 (2004).

Tsuchida et al., "Investigation of Basal Plane Dislocations in the 4H-SiC Epilayers Grown on {0001} Substrates" Materials Science Forum vols. 483-485 (2005) pp. 97-100.

Powell et al., "Surface Morphology of Silicon Carbide Epitaxial Films" J. Electronic Mat. 24(4), 295-301(1995).

* cited by examiner

US 9,464,366 B2

REDUCTION OF BASAL PLANE DISLOCATIONS IN EPITAXIAL SIC

This application claims the benefit of U.S. Provisional Application No. 61/235,455, filed on Aug. 20, 2009. The provisional application and all other publications and patent documents referred to throughout this nonprovisional application are incorporated herein by reference.

TECHNICAL FIELD

The present disclosure is generally related to growth of epitaxial SiC.

DESCRIPTION OF RELATED ART

Since the ABB (Asea Brown Boveri, Inc.—Sweden) power company disclosed the forward voltage, $V_f$, drift problem that degraded their PiN diodes (Lendenmann et al., *Mater. Sci. Forum*, 353-356, 727-730 (2001)), it has been well established that the $V_f$ drift problem is due to stacking faults that originate from basal plane dislocations (BPDs) and that one way to overcome this problem is to reduce the BPD density in low-doped portions of the epitaxial layer that forms the active region of SiC power devices. The primary source of BPDs in the epitaxy is from BPDs in the SiC substrate. At the start of epitaxial growth, 70-90% of the substrate BPDs are converted to threading edge dislocations (TEDs) and the resulting BPD density in the epitaxy is typically in the 100-1000 $cm^{-2}$ range (Ha et al., *J. Cryst. Growth*, 244, 257-266 (2002)). A further reduction to <1 $cm^{-2}$ is required for device production, based on the device area. For devices requiring higher power, the problem of BPDs becomes exacerbated since these devices require larger areas and hence further reduction of BPDs is essential.

Several techniques have been developed to decrease BPD density in the epitaxy. One technique uses a growth interrupt to turn the BPDs into TEDs (US Patent Application Publication No. 2009/0114148). Two other techniques alter the wafer surface before epitaxial growth. The first is a surface patterning process that was originally developed and patented by ABB and later used by Cree (Sumakeris et al., *Mater. Sci. Forum*, 527-529, 141-146 (2006)). The second, developed and patented, by Cree is a process that involves KOH etching, epitaxial growth and repolishing. Cree has tested both processes and found the KOH etching method to be more effective (Sumakeris, Id.). Another technique is to grow the epitaxial layers under very specific conditions on wafers with an offcut angle lower than the standard 8° angle used for 4H-SiC (Chen et al., *J. Appl. Phys.*, 98, 114907 (2005)). The tradeoff is that lowering the offcut angle tends to introduce 3C inclusions that degrade device performance (Kojima et al., *J. Cryst. Growth*, 269, 367-376 (2004)).

BRIEF SUMMARY

Disclosed herein is an article comprising: an off-axis SiC substrate having an off-axis angle of no more than 6°; and a SiC epitaxial layer grown on the substrate. The epitaxial layer has no more than 2, 1, or 0.25 basal plane dislocations per $cm^2$ at the surface of the epitaxial layer.

Also disclosed herein is a method of growing an epitaxial SiC layer on an off-axis SiC substrate comprising: flowing a silicon source gas, a carbon source gas, and a carrier gas into a growth chamber under growth conditions to epitaxially grow SiC on the substrate in the growth chamber. The substrate has an off-axis angle of no more than 6°. The growth conditions include: a growth temperature of 1530-1650° C.; a pressure of 50-125 mbar; a C/H gas flow ratio during epitaxial growth of $9.3 \times 10^{-5}$ to $1.5 \times 10^{-3}$; a C/Si ratio of 0.5-3; a C/H gas flow ratio during ramp to growth temperature from 0 to $5.6 \times 10^{-4}$ and an electron or hole concentration of $10^{13}$-$10^{19}/cm^3$.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

Figure 1A:
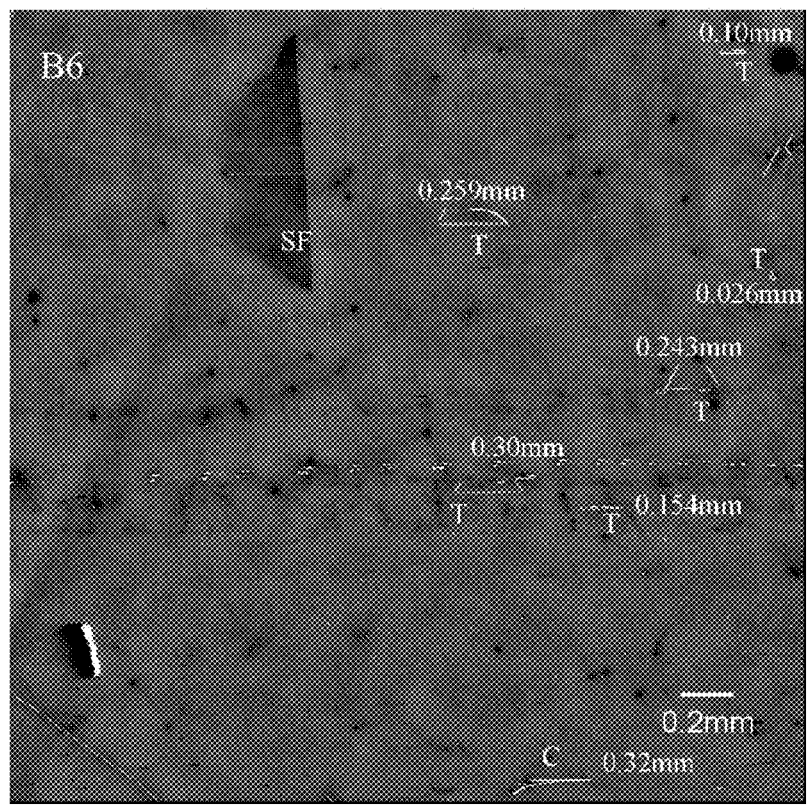
FIG. 1 shows a UVPL image of UID film showing various lengths of BPDs; C—continued, T—turned (converted to TED), where (a) $7 \times 10^{13}$ $cm^{-3}$ grown with 2 sccm propane during ramp and (b) a $3 \times 10^{14}$ $cm^{-3}$ grown with 10 sccm of propane during ramp. Image sizes are 3 mm×3 mm.

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

The purpose of using 4° or other off-axis in the [11-20] direction (0001) oriented substrates for epitaxial SiC growth process is to reduce BPDs within the active regions by converting BPDs to TEDs in the highly doped buffer layer of SiC devices leading to improved device performance and reliability and also to address the economics of SiC substrate manufacture. It has been demonstrated that BPDs cause increasing forward voltage drift in bipolar SiC devices and there are also reports in the literature that they can degrade majority carrier mobility and increase reverse-bias leakage (Agarwal et al., *Elec. Dev. Lett.*, 28, 587 (2007)). BPD reduction processes that utilize epitaxial growth are all based on the principle of converting BPDs into TEDs, the latter of which have negligible adverse electrical effects on the SiC devices.

Without limiting the article or method to any particular mechanism, based on previous work in etching and growth of 4 degree off-cut SiC substrates, it is believed that a phenomenon called "step bunching" may play a role in the conversion of BPDs into TEDs during the growth of epitaxial films on off-cut substrates, but other processes/mechanisms may also be involved. The hypothesis is that the formation of multi-unit cell high surface steps creates a potential barrier to continued basal plane dislocation propagation out of the substrate and that an energy balance is created that makes it more favorable for the BPD to convert to a TED than to continue propagating. This is supported by (Ha et al., *J. Cryst. Growth*, 244, 257-266 (2002)), where they describe that the image force is the driving force of BPD conversion to TED. They speculate that "when the critical distance is small in the range of several bilayers or several nanometers, a dislocation can see two surfaces of the step structure, the terrace and the step, which are different from the average off-axis surface. In this case, the conversion will depend on the step structure". It is also reported that one "can expect that a basal plane dislocation will be attracted by the surface of the last one or two macro-steps and, that the 'step facet mechanism' . . . will be governing the dislocation conversion". Therefore, a processing window that is a function of growth rate, doping, off-cut angle, C/Si ratio, temperature and pressure determine the optimal condition for conversion rate.

The growth on off-axis substrates enables the conversion of BPDs into TEDs. The BPDs turn throughout the growth process. It has been found experimentally that the BPDs may fully convert to TEDs after ~16 μm of growth independent of substrate. The process is repeatable and easy to implement into a manufacturable process. Growing an n+ buffer layer (BL) that is >16 μm thick will enable one to bury the BPDs in the buffer layer, producing a BPD free active region. This is the optimal situation as it will permit the realization of a wide range of high voltage, bipolar devices. Such an active region (or epitaxial layer) may have no more than 2, 1, or 0.25 basal plane dislocations per $cm^2$ throughout the entire thickness of the epitaxial layer or within the thick, low doped layer as is desired in power device technologies.

Other techniques that have been used to convert BPDs to TEDs during epitaxial growth are the three mentioned above. The first is patterning the surface of the SiC wafer before the epitaxial growth, which increases the BPD-to-TED conversion at the beginning of the growth. However, this technique has the tendency to increase other detrimental extended defects such as ingrown faults. The second technique is to etch the wafer in molten KOH before epitaxial growth. This creates pits in the surface at the location where each dislocation (of any type) intersects the surface, including the BPDs, and this technique also increases the BPD-to-TED conversion at the beginning of the growth. However, the top of the growth surface remains pitted creating challenges for device manufacturing. In this approach, an initial layer is grown and the wafer is polished to restore a smooth surface for subsequent device epilayer growth. It should be noted that this latter technique involves multiple steps including wafers polishing, which significantly adds to the overall cost of the final product. Also, a study on low off-cut substrates was performed by Chen and Capano in which they observed a reduction in BPD densities for two specific growth conditions. The BPDs in this investigation were determined by KOH etching, where the first micrometer of the epitaxial surface is etched and the BPD defect is revealed, therefore it cannot accurately account for all BPDs in the layer. They postulate that the lower off-cut angles results in larger image forces which convert the BPDs to TEDs as per Ha et al. (Ha et al., *J. Cryst. Growth*, 244, 257 (2002)). The tradeoff is that lowering the offcut angle tends to introduce step bunching. Further, such growths can lead to polytype inclusions that are also device killers.

The disclosed method has demonstrated production of many SiC epitaxial layers having no more than 1 BPD or 0.25 BPDs/$cm^2$ over a wide process window. The method has been used to demonstrate epilayers with zero BPD over areas consistent high current, high power device technology. The extent of BPD elimination may also be expressed as a conversion rate of BPDs to TEDs. The disclosed devices may demonstrate at least 97%, 99%, or 100% of any BPDs below the surface of the epitaxial layer converted to TEDs during epitaxial growth. Suitable epitaxial layers may be, but are not limited to, 10-400 μm thick.

The growth conditions may be as described above, or more specifically: off-axis angle of 4°, growth temperature of 1570-1590° C., pressure of 50 or 90-110 mbar, C/H gas flow ratio during ramp to growth of $1.88\times10^{-5}$-$2.06\times10^{-4}$, C/Si ratio of 0.7-1.6, and electron or hole concentration f $10^{13}$-$10^{19}$. A 4° substrate refers to such substrates as they are commonly available. Thus, the substrate may not be precisely 4°, but may still be considered a 4° substrate. Likewise, commonly available on-axis substrates may not be precisely 0° but may still be considered an on-axis substrate. The C/Si ratio refers to moles of atoms, not moles of gas molecules.

The following examples are given to illustrate specific applications of the technique. These specific examples are not intended to limit the scope of the disclosure in this application.

EXAMPLES

Epitaxial layers were grown in an Aixtron/Epigress VP508 horizontal hot-wall reactor using the standard chemistry of silane ($SiH_4$, 2% in $H_2$) and propane ($C_3H_8$). Growth took place by varying growth conditions as in Table 1. The films were either unintentionally (UID, $N_D$-$N_A$<$4\times10^{14}$ $cm^{-3}$) doped or intentionally (ID, $N_D$-$N_A$<$2\times10^{15}$ $cm^{-3}$) doped using a nitrogen source gas, with the ID films having a '*' next to the sample number. All films were grown at a temperature of 1580° C., pressure of 100 mbar and gas phase carbon-to-silicon (C/Si) ratio of 1.55, with the exception of samples 7 and 9, which had a C/Si ratio equal to 0.8 and samples 11-13 had C/Si ratio of 1.8. Propane was introduced during the ramp to growth temperature for T≥1400° C. (Lew et al., *Mater. Sci. Forum*, 556-557, 513-516 (2007)). The propane flow rate during ramp was varied for various growth runs (2 (C/H=$3.8\times10^{-5}$), 5 (C/H=$9.38\times10^{-5}$), and 10 (C/H=$1.88\times10^{-4}$) sccm) as indicated in column 2 of Table 1. Samples were also investigated to determine the influence of buffer layers, therefore, some samples included a 5-20 μm thick n+ buffer layer, while others did not. The buffer layer thickness is indicated in Table 1. All samples were between 16 and 35 μm thick (not including buffer layers, where applicable and all were grown at ~10 μm/h, with the exception of sample 9, which was grown at 5 μm/h.

TABLE 1

Tabulation of basal plane dislocations conversion efficiency for epitaxial growth on 4° off-axis substrates. Note, $C_3H_8$ flow corresponds to propane flow during ramp.

| Sample ID | $C_3H_8$ Flow (sccm) | Epilayer Thickness (μm) | $N_D$-$N_A$ ($cm^{-3}$) | BL (μm) | Initial BPD | Turned BPD | % Converted | BPD cont'd ($cm^{-3}$) |
|---|---|---|---|---|---|---|---|---|
| 1 | 10 | 18.1 | $3\times10^{14}$ | 4.6 | 85 | 84 | 98.8 | 0.19 |
| 2 | 2 | 17.6 | $7\times10^{13}$ | 4.4 | 602 | 602 | 100 | 0 |

TABLE 1-continued

Tabulation of basal plane dislocations conversion efficiency for epitaxial growth on 4° off-axis substrates. Note, $C_3H_8$ flow corresponds to propane flow during ramp.

| Sample ID | $C_3H_8$ Flow (sccm) | Epilayer Thickness (μm) | $N_D$-$N_A$ (cm$^{-3}$) | BL (μm) | Initial BPD | Turned BPD | % Converted | BPD cont'd (cm$^{-3}$) |
|---|---|---|---|---|---|---|---|---|
| 3* | 2 | 17.8 | $9 \times 10^{13}$ | 4.4 | 438 | 425 | 97 | 2.36 |
| 4* | 2 | 17.8 | $1.4 \times 10^{15}$ | 4.4 | 660 | 659 | 99.8 | 0.2 |
| 5* | 5 | 15.3 | $1.5 \times 10^{14}$ | 3.5 | 91 | 91 | 100 | 0 |
| 6* | 2 | 17.5 | $-6 \times 10^{13}$ | 0 | 181 | 181 | 100 | 0 |
| 7* | 2 | 16.8 | $1 \times 10^{16}$ | 0 | 133 | 133 | 100 | 0 |
| 8* | 2 | 35.1 | $7 \times 10^{14}$ | 0 | 144 | 144 | 100 | 0 |
| 9* | 2 | 14.1 | $5.4 \times 10^{15}$ | 0 | 122 | 121 | 99.2 | 0.18 |
| 10 | 2 | 16.3 | $-2.4 \times 10^{14}$ | 12.8 | 16 | 16 | 100 | 0 |
| 11 | 2 | 16.1 | $-2.4 \times 10^{15}$ | 19.8 | 155 | 155 | 100 | 0 |
| 12 | 2 | 15.3 | $-1.3 \times 10^{14}$ | 18.9 | 117 | 117 | 100 | 0 |
| 13 | 2 | 15.3 | $-2 \times 10^{14}$ | 19.1 | 652 | 652 | 100 | 0 |
| 14 | 2 | 15.5 | $-1.1 \times 10^{14}$ | 19.5 | 54 | 54 | 100 | 0 |
| 15 | 2 | 15.7 | $1.1 \times 10^{14}$ | 19.6 | 29 | 28 | 96.6 | 0.18 |
| 16 | 2 | 23.4 | $3 \times 10^{14}$ | 0 | 1379 | 1378 | 99.9 | 0.17 |
| 17 | 2 | 20.1 | $1.1 \times 10^{14}$ | 19.1 | 23 | 20 | 87.0 | 0.52 |
| 18 | 2 | 20.1 | $8.3 \times 10^{14}$ | 19.0 | 1 | 1 | 100 | 0 |
| 19 | 2 | 20.3 | | 19.1 | 22 | 22 | 100 | 0 |
| 20 | 2 | 20.1 | | 19.2 | 19 | 19 | 100 | 0 |
| 21 | 2 | 20.0 | $-9.4 \times 10^{13}$ | 0 | 90 | 90 | 100 | 0 |
| 22 | 2 | 19.9 | $-1.2 \times 10^{14}$ | 0 | 259 | 259 | 100 | 0 |
| 23 | 2 | 19.9 | | 0 | 480 | 480 | 100 | 0 |
| 24 | 2 | 19.9 | | 0 | 170 | 170 | 100 | 0 |
| 25 | 2 | 19.9 | $1.0 \times 10^{14}$ | 4.9 | 170 | 169 | 99.4 | 0.18 |
| 26 | 2 | 19.9 | $-1.0 \times 10^{14}$ | 5.0 | 102 | 101 | 99.0 | 0.17 |
| 27 | 2 | 20.0 | | 5.0 | 47 | 47 | 100 | 0 |
| 28 | 2 | 20.0 | | 5.0 | 73 | 72 | 98.6 | 0.17 |

Sample 10 was created by incorporating a 12.8 μm buffer layer (~$8 \times 10^{17}$ cm$^{-3}$ n-type) to convert the original BPDs in the highly doped buffer layer. A 16 μm thick UID epilayer was then grown on top. The number of initial BPDs at the buffer layer/UID epilayer interface in the quarter wafer was 16. All of the BPDs converted to TEDs within the first half of the UID layer growth. Sample 19 was grown with a 20 μm BL and a 20 μm UID layer on top, resulting in only one BPD in the entire ¼ of a 3" sample, proving that the BPDs can be converted in a highly doped BL, eliminating them from the active region of a device.

Substrate offcut angle was determined by X-ray rocking curve maps of the (008) symmetric reflection across the full 3-inch wafer using a PANalytical X'Pert Pro MRD system (the CuK$\alpha_1$ line was used). Ultraviolet photoluminescence (UVPL) images were taken and the software program, "ImageJ" was used to identify the BPDs and determine their lengths within the epitaxial layer (for $N_D$-$N_A$<$2 \times 10^{16}$ cm$^{-3}$). A Digital Instruments Nanoscope Dimension IIIa atomic force microscopy (AFM) in tapping mode was used to determine the surface roughness, while the morphology was evaluated using Nomarski microscopy. Fourier transform infrared (FTIR) spectrometry was employed to determine film thickness. The electrical properties of the films were analyzed using Hg probe and Schottky diode capacitance-voltage measurements.

Figure 1B:
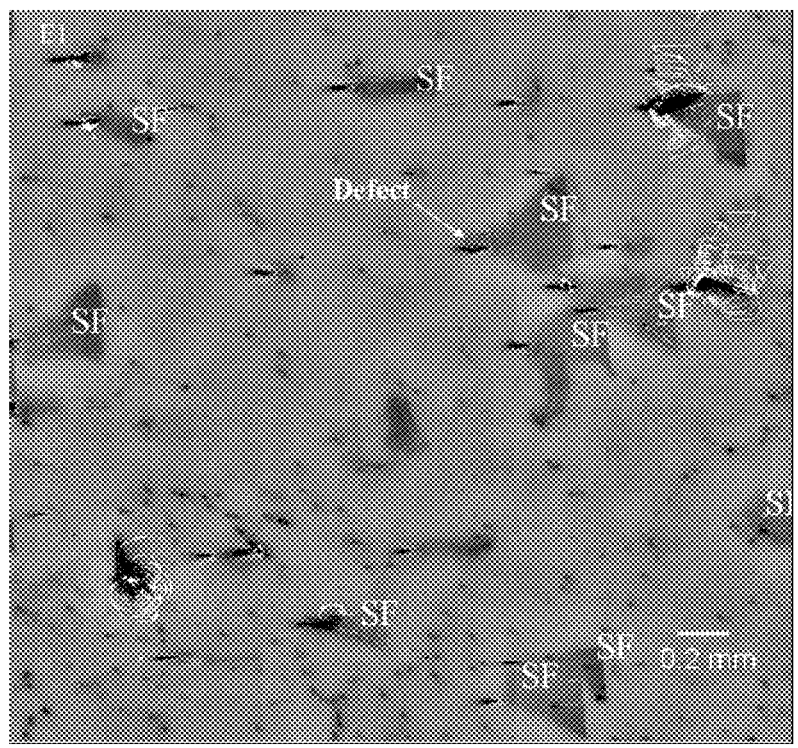

The BPD lengths were then measured from the UVPL images by measuring the horizontal length from left to right of the BPD (FIG. 1). The conversion of BPDs into TEDs was observed throughout the epitaxial layer, i.e. from the substrate/epi interface to at or near the surface, or from the top of the buffer layer to at or near the surface, if a buffer layer was used. This can be seen in the UVPL image, FIG. 1(a), by the various lengths of the BPDs (white lines in the image with variable lengths as measured from left to right). It has been reported that BPDs convert to TEDs near the epilayer/substrate interface (Ha et al., J. Cryst. Growth, 244, 257 (2002)), therefore, it is assumed that the same has occurred in these epitaxial layers. However, whatever BPDs have continued into the epilayer do convert to TEDs throughout epitaxial growth. The T indicates the turned (converted) BPDs, C represents continued BPD, and SF identifies in-grown stacking faults. The converted BPDs varied in length from 0.07 to 0.27 mm, with the continued BPDs being ~0.32 mm in length, calculated from the measured local epitaxial thickness and local offcut angle. Assuming the length of the imaged BPD is an indicator of when it turned in the epilayer, approximately 72% of the BPD turned before 10 of the 20 μm was grown, while ~42% turned before 5 μm was grown.

Figure 2:
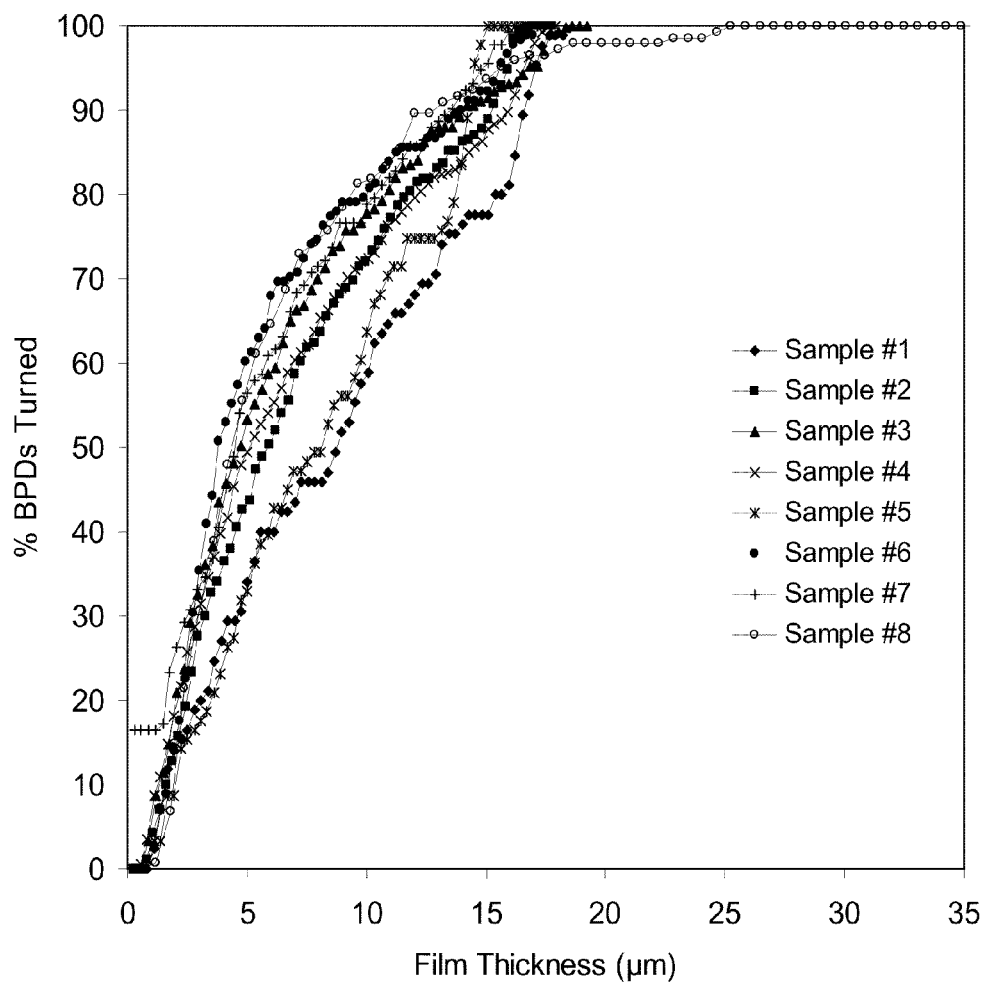
FIG. 2 shows the percent of BPDs converting to TEDs within the thickness of the epilayers for samples grown on 4° off-axis SiC substrates.

The lengths of the BPDs were then tallied and the conversion efficiency was based on comparing the actual length of each BPD to the full length BPD. With the variation of lattice curvature across a quarter wafer, it was essential to obtain the precise local measurement of the off-cut angle across the substrate, combined with the accurate local film thickness to correctly identify the actual BPD full length and correctly reveal the trend of BPDs converting to TEDs within the epilayer. The conversion efficiency profile for these samples is shown in FIG. 2. The profiles for each sample characterized resulted in the similar trends, indicating that the mechanism for converting BPDs into TEDs within the films is the same. Doping influences on the conversion efficiency were assessed with samples 3-9 over the free carrier concentration range from $6 \times 10^{13}$ to $1 \times 10^{16}$ cm$^{-3}$. Note that the reactor background carrier concentration was p-type for some of the runs, which explains why some samples are p-type. The conversion was ≥97% for these films, indicating that a doping density below $1 \times 10^{16}$ cm$^{-3}$ does not significantly influence the conversion efficiency.

This process for determining conversion efficiency can be more accurate than others used in the field. Typically, the BPD density is found using KOH etching, which creates etch pits on the surface of the wafer, and these pits are counted. Previously, the lowest BPD density that has been published in the literature is 2.6 cm$^2$ using KOH etching (Chen et al., *J. Appl. Phys.*, 98, 114907 (2005)). If the above samples had been investigated using KOH etching, the BPD density would be zero for the majority of the samples because none of the BPDs intersect the surface (a requirement for pit formation). However, from the UVPL images, it is seen that the BPDs are turning throughout the film on 4° off-cut substrates. By using the KOH etching approach, the number of BPDs in the active region may be much higher than what is at the surface of the epilayer. By employing the UVPL technique, the total number of BPD in the entire active region is determined. Therefore, the result of 1 BPD in the UID film demonstrates a significant advancement.

The influence of a buffer layer on the conversion of BPDs to TEDs was also investigated. It is desired to convert all BPDs to TEDs in the buffer layer to eliminate any effects from BPDs in the active region of the device All films resulted in ≥97%, indicating that the presence of a buffer layer did not influence the conversion efficiency. The BPDs turned within the first ~16 μm for all films which were grown with 100% conversion, whether a buffer layer was included or not.

Figure 3A:
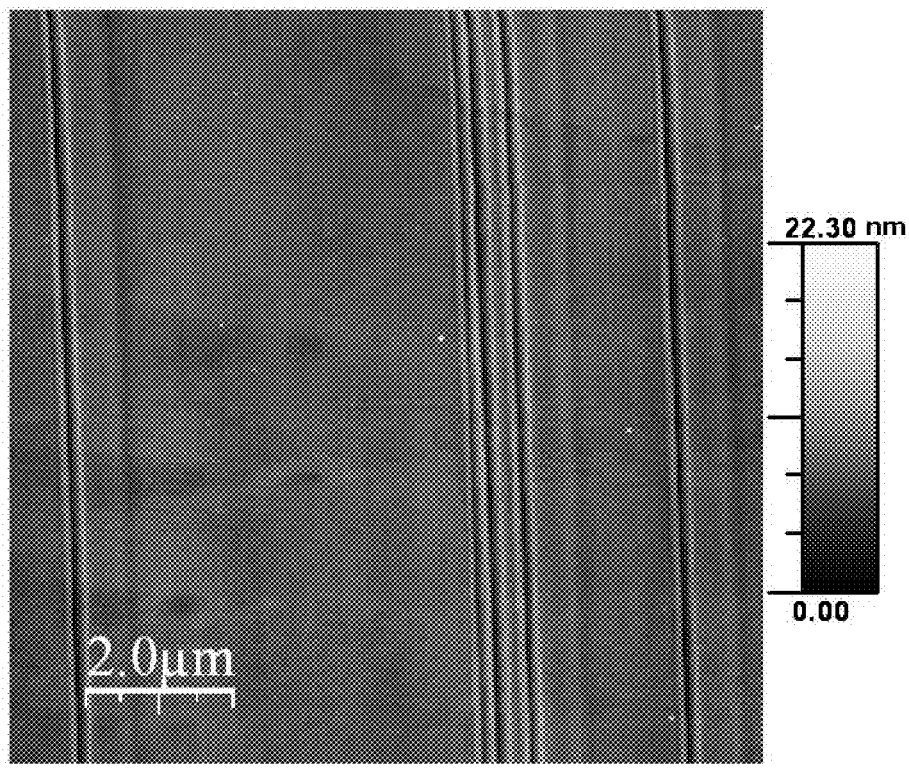
FIG. 3 shows AFM micrographs of epilayers grown on 4° off-axis substrates with a C/Si ratio of (a) 0.8 and (b) 1.55. Scan area is 10 μm×10 μm. Surface roughness is 1.34 nm and 4.03 nm RMS for (a) and (b), respectively.
Figure 3B:
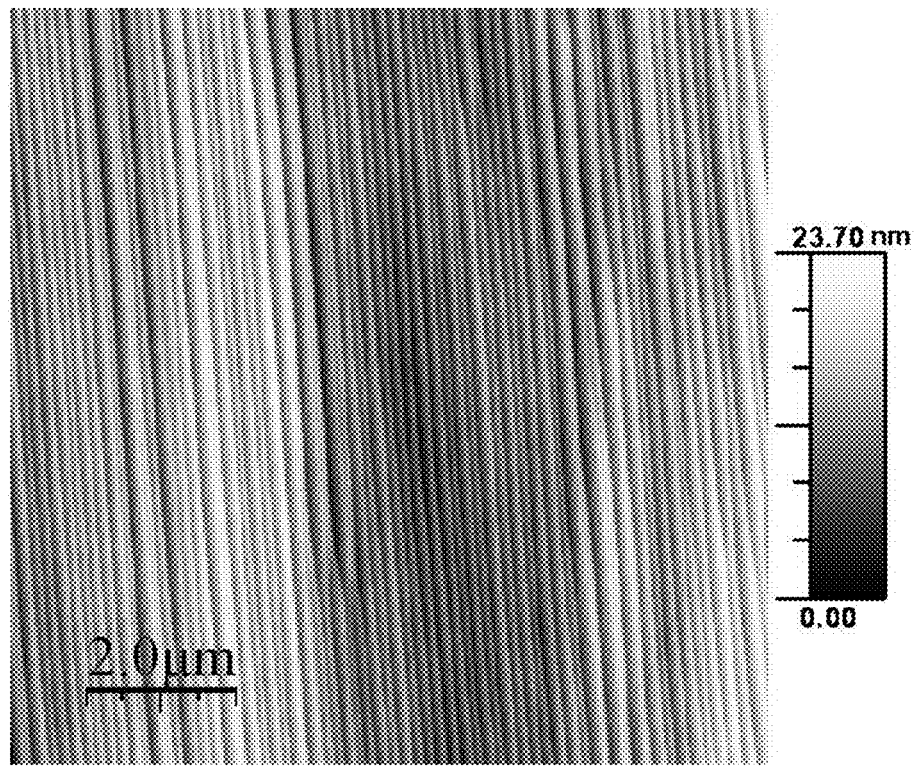

An initial investigation of the influence of surface morphology on the conversion process was made by changing the C/Si ratio and, therefore, the degree of step-bunching on the epi surface (Lew et al., *Mater. Sci. Forum*, 556-557, 513 (2007)). A C/Si ratio of 0.8 was employed to reduce step bunching (FIG. 3). The bilayer step morphology with intermittent macrosteps resulted in the same conversion efficiency as films grown with the higher C/Si ratio. This contradicts the findings of Chen and Capano (Chen et al., *J. Appl. Phys.*, 98, 114907 (2005)), which reported low BPD density only for a C/Si ratio of 2. It should be noted that the optimized process of Chen was for surface morphology and doping, not BPD reduction. Further in Chen's work, in order to reduce BPDs, the C/Si ratio has to increase, which converts the layer from n-type to p-type, making this process impossible to incorporate into a buffer layer.

The influence of $C_3H_8$ flow during the ramp to growth was also investigated. As can be seen in Table 1, sample 1 (ramped with 10 sccm of propane) resulted in the lowest initial BPDs at the epi/substrate interface (85 initial BPDs). Similarly, sample 5 (ramped with 5 sccm of propane) also resulted in a low initial BPD count of 91 for the same boule and quadrant. In contrast, sample 4 (660 initial BPDs) was grown on an adjacent substrate taken from the same quadrant of the boule as sample 1, which was ramped with 2 sccm of propane. This implies higher $C_3H_8$ flows during ramp to growth temperature result in lower initial BPD densities and potentially more effective conversion in buffer layer (less thickness required). A potential penalty for the high propane flow rate (10 sccm) is an increased stacking fault density (49 vs. 1.4 cm$^{-2}$) (FIG. 1(*b*)).

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular.

What is claimed is:

1. An article comprising:
   an off-axis (0001) oriented SiC substrate having an off-axis angle in the [11-20] direction of no more than 6°;
   a SiC buffer layer grown directly on the substrate;
     wherein the buffer layer is at least 13 microns thick;
     wherein at least 97% of initial basal plane dislocations in the buffer layer at the substrate/buffer interface are converted to threading edge dislocations within at most the first 16 microns of the buffer layer adjacent to the substrate; and
   a SiC epitaxial layer grown directly on the buffer layer.

2. The article of claim 1, wherein the epitaxial layer has no more than 0.25 basal plane dislocations per cm$^2$ throughout the entire thickness of the epitaxial layer.

3. The article of claim 1, wherein at least 99% of any basal plane dislocations at the substrate/buffer interface are converted to threading edge dislocations within the buffer layer.

4. The article of claim 1, wherein the substrate has an off-axis angle in the [11-20] direction of 4°.

5. The article of claim 1, wherein the epitaxial layer has an electron or hole concentration of $10^{13}$-$10^{19}$/cm$^3$.

6. The article of claim 1, wherein the epitaxial layer is 10-400 microns thick.

7. The article of claim 1, wherein the buffer layer is doped at about $8 \times 10^{17}$ cm$^{-3}$.

8. The article of claim 1, wherein the epitaxial layer has no more than 2 basal plane dislocations per cm$^2$ throughout the entire thickness of the epitaxial layer.

9. The article of claim 1, wherein the buffer layer is at least 16 microns thick.

10. The article of claim 1, where the article is made by a process comprising:
    flowing a silicon source gas, a carbon source gas, and a carrier gas into a growth chamber under growth conditions to epitaxially grow a SiC buffer layer directly on the substrate in the growth chamber;
      wherein the buffer layer is at least 13 microns thick; and
      wherein at least 97% of initial basal plane dislocations in the buffer layer at the substrate/buffer interface are converted to threading edge dislocations within at most the first 16 microns of the buffer layer adjacent to the substrate; and
    flowing the silicon source gas, the carbon source gas, and the carrier gas into a growth chamber under growth conditions to epitaxially grow a SiC epitaxial layer directly on the buffer layer in the growth chamber;
      wherein the substrate has an off-axis angle in the [11-20] direction of no more than 6°;
      wherein the growth conditions include:
        a growth temperature of 1530-1650° C.;
        a pressure of 50-125 mbar;
        a C/H gas flow ratio of $9.3 \times 10^{-5}$ - $1.5 \times 10^{-3}$;
        a C/H gas flow ratio during ramp of 0-$5.6 \times 10^{-4}$;
        a C/Si ratio of 0.5-3; and
        an electron or hole concentration of $10^{13}$-$10^{19}$ /cm$^3$.

11. The article of claim 10;
    wherein the substrate has an off-axis angle in the [11-20] direction of 4°; and
    wherein the growth conditions include:
      a growth temperature of 1570-1590° C.;
      a pressure of 50-110 mbar;
      a C/H gas flow ratio during ramp of $1.88 \times 10^{-5}$- $2.06 \times 10^{-4}$;
      a C/Si ratio of 0.7-1.6; and
      an electron or hole concentration of $10^{13}$-$10^{19}$ cm$^3$.

12. A method of growing an epitaxial SiC layer on an off-axis (0001) oriented SiC substrate comprising:
flowing a silicon source gas, a carbon source gas, and a carrier gas into a growth chamber under growth conditions to epitaxially grow a SiC buffer layer directly on the substrate in the growth chamber;
wherein the buffer layer is at least 13 microns thick; and
wherein at least 97% of initial basal plane dislocations in the buffer layer at the substrate/buffer interface are converted to threading edge dislocations within at most the first 16 microns of the buffer layer adjacent to the substrate; and
flowing the silicon source gas, the carbon source gas, and the carrier gas into a growth chamber under growth conditions to epitaxially grow a SiC epitaxial layer directly on the buffer layer in the growth chamber;
wherein the substrate has an off-axis angle in the [11-20] direction of no more than 6°; and
wherein the growth conditions include:
a growth temperature of 1530-1650° C.;
a pressure of 50-125 mbar;
a C/H gas flow ratio of $9.3 \times 10^{-5}$ - $1.5 \times 10^{-3}$;
a C/H gas flow ratio during ramp of $0$-$5.6 \times 10^{-4}$;
a C/Si ratio of 0.5-3; and
an electron or hole concentration of $10^{13}$-$10^{19}$ /cm$^3$.

13. The method of claim 12;
wherein the substrate has an off-axis angle in the [11-20] direction of 4°; and
wherein the growth conditions include:
a growth temperature of 1570-1590° C.;
a pressure of 50-110 mbar;
a C/H gas flow ratio during ramp of $1.88 \times 10^{-5}$ - $2.06 \times 10^{-4}$;
a C/Si ratio of 0.7-1.6; and
an electron or hole concentration of $10^{13}$-$10^{19}$/cm$^3$.

14. The method of claim 12, wherein the carbon source gas is propane and the silicon source gas is silane.

15. The method of claim 12, wherein the growth is maintained to grow a 10-400 micron thick epitaxial layer.

16. The method of claim 12, further comprising:
before growing the epitaxial layer, increasing the temperature in the growth chamber from ambient conditions to the growth conditions while having a C/H gas flow ratio into the growth chamber of no more than $5.6 \times 10^{-4}$.

17. The method of claim 12, wherein the buffer layer is doped at about $8 \times 10^{17}$ cm$^{-3}$.

18. The method of claim 12, wherein the epitaxial layer has no more than 2 basal plane dislocations per cm$^2$ throughout the entire thickness of the epitaxial layer.

* * * * *